United States Patent
Chayut

(10) Patent No.: US 7,274,568 B1
(45) Date of Patent: Sep. 25, 2007

(54) APPARATUS AND METHOD FOR COOLING SEMICONDUCTOR DEVICES

(75) Inventor: Ira G. Chayut, Cupertino, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 11/594,584

(22) Filed: Nov. 7, 2006

Related U.S. Application Data

(62) Division of application No. 10/853,432, filed on May 24, 2004.

(51) Int. Cl.
*H05K 7/20* (2006.01)
*F28F 7/00* (2006.01)
*H01L 23/34* (2006.01)
*B23P 15/00* (2006.01)

(52) U.S. Cl. .............. 361/699; 165/80.4; 257/714; 29/890.035

(58) Field of Classification Search ......... 361/698–699
See application file for complete search history.

(56) References Cited

U.S. PATENT DOCUMENTS

| 5,497,573 | A | * | 3/1996 | Stadjuhar et al. ............ 40/564 |
| 5,718,628 | A | * | 2/1998 | Nakazato et al. ........... 454/184 |
| 5,901,037 | A | | 5/1999 | Hamilton et al. ........... 361/699 |
| 6,521,516 | B2 | | 2/2003 | Monzon et al. ............. 438/514 |
| 6,704,200 | B2 | | 3/2004 | Zeighami et al. ........... 361/700 |
| 6,775,137 | B2 | * | 8/2004 | Chu et al. .................... 361/696 |
| 2004/0145047 | A1 | | 7/2004 | Kim et al. .................. 257/712 |

* cited by examiner

*Primary Examiner*—Greg Thompson

(57) ABSTRACT

An apparatus and method for cooling semiconductor devices. A cooling system for semiconductor devices is disclosed and includes a semiconductor substrate, horizontal channels and a cooling medium. Specifically, the semiconductor substrate is incorporated into a die. Also, one or more horizontal channels are formed in a backside of the semiconductor substrate of the die. The horizontal channels collect thermal energy that is generated by electrical components located on a front side of the semiconductor substrate. A cooling medium circulates within the one or more horizontal channels for transferring the thermal energy away from the die.

10 Claims, 9 Drawing Sheets

500A

200A

200B

200C

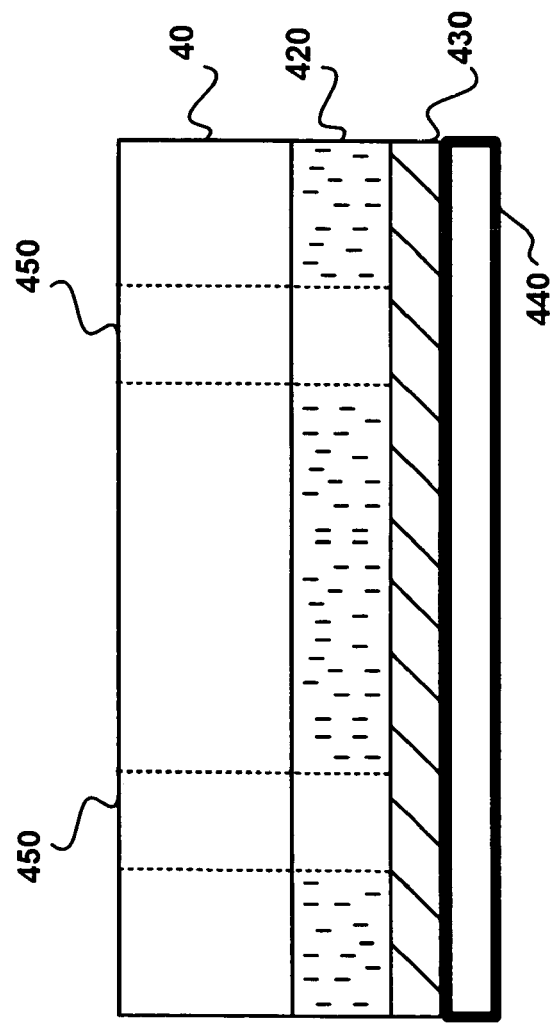

700
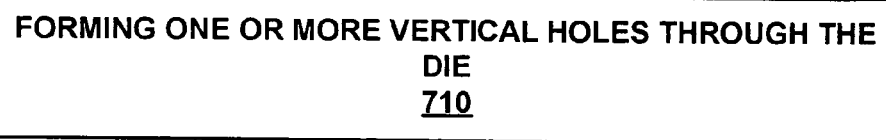
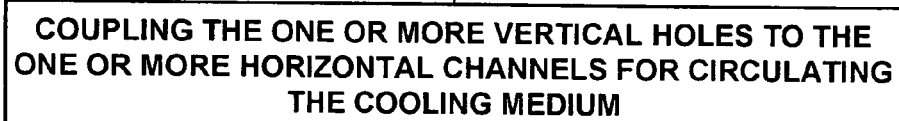
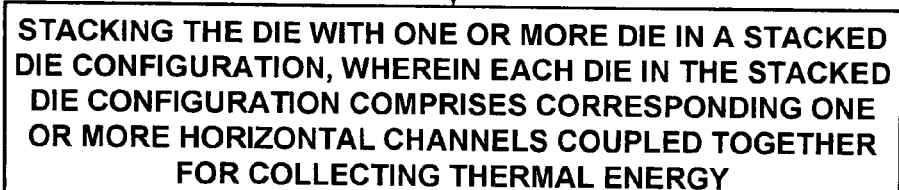
FIGURE 7

APPARATUS AND METHOD FOR COOLING SEMICONDUCTOR DEVICES

CROSS REFERENCE TO RELATED APPLICATION

This patent application claims priority and is a Divisional of co-pending, commonly-owned patent application Ser. No. 10/853,432, filed on May 24, 2004, entitled "Apparatus and Method for Cooling Semiconductor Devices", by Ira Chayut, and assigned to the assignee of the present invention, the disclosure of which is incorporated herein by reference.

BACKGROUND OF THE INVENTION

1. Field of the Invention

Embodiments of the present invention relate to the field of integrated circuits. More particularly, embodiments of the present invention relate generally to cooling systems for transferring thermal energy away from integrated circuits.

2. Related Art

The trend in decreasing the size of semiconductor components leads to smaller electronic devices that are computationally more powerful than their older counterparts. For example, mobile devices, such as cell phones and personal digital assistants, are packed with multiple functionalities that in the past were isolated to single devices. Cells phones that previously were limited to transmitting and receiving mobile phone calls, and possibly an address book, now function as phones, calendars, address books, cameras, etc. Moreover, these multiple functionalities are increasing from year to year. In addition, more powerful devices, such as laptop computers, also are enjoying an increase in computing power and reduced size.

To increase functionality in the same or smaller space for devices, various techniques can be employed to increase density in integrated circuits of the electronic devices. For instance, the silicon wafer upon which an integrated circuit chip or die is formed can be thinned. In some instances, the silicon wafer can be thinned by as much as 90 percent of its original thickness. In this way, electronic devices incorporating the thinner silicon wafer can also be made to be thinner. In addition, stacking multiple dies in a single package can increase the density of semiconductor components in an electronic device. As a result, if the dies in a stacked die configuration have been thinned, more dies can be incorporated within the same or smaller amount of space as compared to previous generations of an electronic device.

Thermal management of integrated circuits is of a primary concern especially in light of the continual decrease in size of electrical components and the devices that house those components. Typical systems and methods for cooling integrated circuits include active cooling techniques, such as fans for passing air over the integrated circuits to dissipate thermal energy. However, fans require battery power for operation which is problematic for battery operated devices. In addition, active cooling techniques employing fans require air flow through the electronic device for cooling, thereby requiring the electronic device to be of a sufficient size to accommodate air flow and cooling. This puts a minimum limit on the size of the electronic device. This minimum limit may be too large to accommodate the trend towards smaller devices.

In addition, heat sinks have been directly coupled to the die in order to dissipate its thermal energy. In one case, these heat sinks that are attached to the die can be cooled through direct transfer of thermal energy to air circulated by fans. In another case, the heat sinks circulate a cooling medium to a remote heat exchanger through which thermal energy is dissipated. In either case, the attached heat sinks negatively increase the size of the die. This in turn increases the size of the electronic device incorporating the die and the attached heat sink.

In addition, these traditional systems and methods provide limited cooling of stacked die configurations. For instance, an active cooling mechanism employing circulating air relies on maximizing the surface area on the die for the transfer of thermal energy. However, in a stacked die configuration, exposed surface area of the die is significantly reduced, thereby reducing the effectiveness of active cooling systems incorporating the circulation of air. For example, the middle die in a three die stacked die configuration has very limited surface area for dissipating heat. Also, attaching a heat sink to the top of a die stacked configuration only effectively cools the uppermost die of the stacked die configuration, resulting in limited or no cooling of the lower die in the stacked die configuration.

As a result, traditional cooling systems and cooling methods for integrated circuits provide limited cooling as the density of components increases on dies, either through the shrinkage in size of the electrical components, or through a combination of component shrinkage and the placement of dies in a stacked die configuration.

SUMMARY OF THE INVENTION

Accordingly, various embodiments of the present invention disclose an apparatus and method for cooling semiconductor devices. As a result, embodiments of the present invention are capable of cooling the higher density dies by incorporating a cooling system within the semiconductor substrate of the die itself. In addition, by incorporating the cooling mechanism within the semiconductor substrate of the die, proper cooling of dies within a stacked die configuration is maintained.

In one embodiment, a cooling system for semiconductor devices incorporating horizontal channels is disclosed. The cooling system includes a semiconductor substrate that is incorporated within a die including an integrated circuit. In addition, the cooling system further includes one or more horizontal channels that are formed in a backside of the semiconductor substrate of the die. The horizontal channels collect thermal energy that is generated by electrical components located on a front side of the semiconductor substrate. Further, the cooling system includes a cooling medium that circulates within the one or more horizontal channels. The cooling medium transfers away the thermal energy generated from the die.

In another embodiment, a cooling system for semiconductor devices incorporating vertical holes is disclosed. The cooling system includes a die that incorporates a semiconductor substrate. In addition, the cooling system further includes one or more horizontal channels that are formed under a backside of the semiconductor substrate of the die. The horizontal channels collect thermal energy that is generated by the electrical components located on a front side of the semiconductor substrate. Also, the cooling system includes a cooling medium that is circulated within the one or more horizontal channels for transferring the thermal energy away from the die. Furthermore, the cooling system includes one or more vertical holes formed within the die. The vertical holes are coupled to the one or more horizontal channels for circulating the cooling medium.

In still another embodiment a method for cooling semiconductor devices is disclosed. The method includes forming one or more horizontal channels in a backside of a semiconductor substrate. The horizontal channels collect thermal energy generated by electrical components located on a front side of a die incorporating the semiconductor substrate. The method also includes the circulation of a cooling medium through the one or more horizontal channels for transferring thermal energy away from the die.

BRIEF DESCRIPTION OF THE DRAWINGS

FIG. 4 is a cross sectional view of a die illustrating a vertical hole for the circulation of a cooling medium for cooling the die, in accordance with one embodiment of the present invention.

FIG. 7 is a flow chart illustrating steps in a method for cooling a die through the use of vertical holes, in accordance with one embodiment of the present invention.

DETAILED DESCRIPTION OF THE INVENTION

Reference will now be made in detail to the preferred embodiments of the present invention, an apparatus and method for cooling semiconductor devices, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, various embodiments of the present invention disclose an apparatus and method for cooling semiconductor devices located on an integrated circuit die, or chip. As a result, embodiments of the present invention are capable of cooling higher density dies by incorporating a cooling system within the semiconductor substrate of the die itself. This allows continued shrinkage of the die without adding additional cooling devices onto the die for cooling applications. In addition, by incorporating the cooling mechanism within the semiconductor substrate of the die, proper cooling of dies within a stacked die configuration is maintained.

Figure 1A:
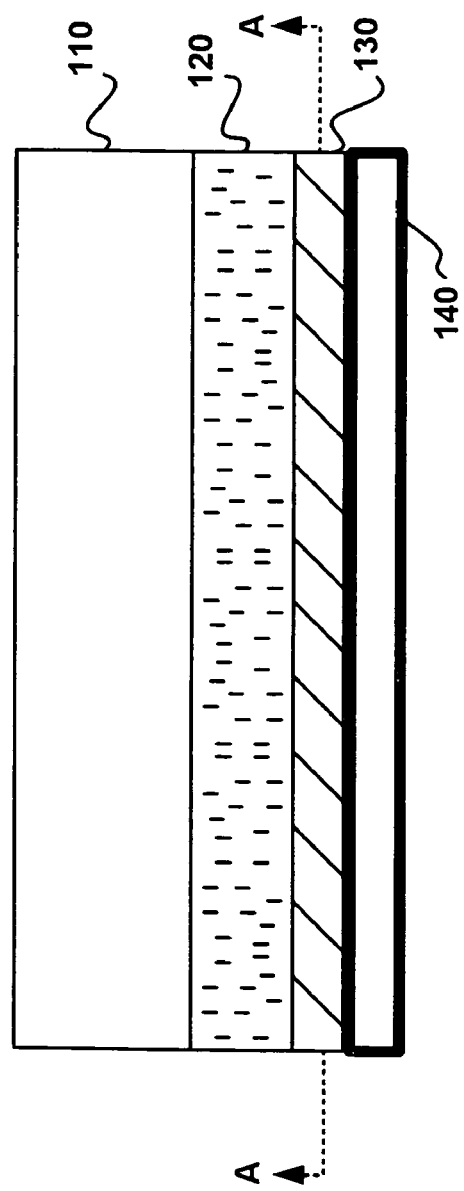
FIG. 1A is a cross sectional view of a die illustrating an integrated horizontal channel for the circulation of a cooling medium for cooling, in accordance with one embodiment of the present invention.

Referring now to FIG. 1A, a cross sectional view of a die 100A is shown illustrating the use of integrated horizontal channels for cooling the die, in accordance with one embodiment of the present invention. Embodiments of the present invention as shown in FIG. 1A are illustrative of the use of integrated horizontal channels for cooling exemplary die structures of integrated circuits.

The die 100A comprises a cooling system for cooling semiconductor devices, or components that are located on a front side of a semiconductor substrate 120. The components are formed in an active region 110 of the die 100A. When in operation, the components in the active region 110 generate thermal energy. Proper management of the thermal energy ensures that the components of the die continue to operate according to their specifications.

As shown in FIG. 1A, one or more horizontal channels 130 are formed in a backside of the semiconductor substrate 120. The horizontal channels are used for collecting thermal energy that is generated by the components in the active region 110 as transferred through the substrate 120. In one embodiment, the horizontal channels 130 may have a 3 to 1 aspect ratio when compared to the die structure to include the active region 110, the substrate 120, and the horizontal channels 130, but may also have other ratios.

In addition, the cooling system as shown in FIG. 1A includes a cooling medium that is circulated within the one or more horizontal channels. The cooling medium transfers the thermal energy away from the die 100A. The cooling medium can be circulated to a heat exchanger (not shown) passively or actively. In that way, the thermal heat that is generated by the components in the active region 110 is transferred away from the die 100A. In embodiments of the present invention, the heat exchanger is integrated within a package that includes the die 100A. In other embodiments of the present invention, the heat exchanger is located remotely from the die 100A.

In one embodiment of the present invention, the cooling medium may comprise a gas. As a result, the horizontal channels 130 can be of a capillary size, in one embodiment. This promotes thinner die structures since the horizontal channels that are integrated within the semiconductor substrate 120 are of small dimensions. The cooling system is pressurized in order to ensure the proper circulation of the gas through the horizontal channels 130. The gas used for cooling the die is inert, in one embodiment, such as inert fluorine gas. In other embodiments, the gas is taken from the group forming the halogen elements. Other embodiments are well suited other types of gases for cooing the die 100A.

In another embodiment of the present invention, the cooling medium may comprise a fluid. The horizontal channels 130 circulate the cooling medium to transfer thermal energy from the die 100A. A pump (not shown) is used to circulate the fluid through the cooling system. The fluid used for cooling the die is non-reactive with the semiconductor substrate 120. In one embodiment, the fluid is pure water. Other embodiments are well suited to other fluids for cooling the die.

In still another embodiment, the cooling medium comprises a two phase medium. For example, the cooling system may employ a passive system for cooling the die 100A in which a gas is formed when collecting and transferring thermal energy. The gas is used to transfer thermal energy away from the die, but is cooled to a fluid form at the heat exchanger.

In still another embodiment, the cooling medium may comprise thin conductive wires. The thin wires are integrated within the substrate 130 for conducting thermal energy away from the die 100A. In another embodiment, the cooling medium comprises an oil based medium.

The die 100A also includes a cap 140. The cap 140 seals the horizontal channels 130 so that the cooling medium is confined to circulate only through the horizontal channels 130.

Integrating the horizontal channels in the semiconductor substrate 120 of the die 100A allows the cooling system to be located close to the heat source. That is, the horizontal channels are located in close proximity to the source of the thermal energy, the components in the active region 110. As a result, the horizontal channels promote more efficient cooling of the die 100A.

In addition, the semiconductor substrate 120 can be further thinned in order to shrink the overall size of the die 100A. As an added benefit, thinning of the substrate 120 brings the horizontal channels 130 even closer to the source of the thermal energy, the components in the active region 110 for better transfer of the thermal energy away from the die 100A.

Also, by integrating the horizontal channels 130 into the semiconductor substrate 120 the overall size of the die 100A is controlled. As a result, proper implementation of the horizontal channels 130 for cooling the die allows for the continual shrinkage of the die structure thereby maintaining the movement towards smaller electronic devices incorporating the integrated circuits on the die (e.g., die 100A) that are computationally more powerful.

Figure 1B:
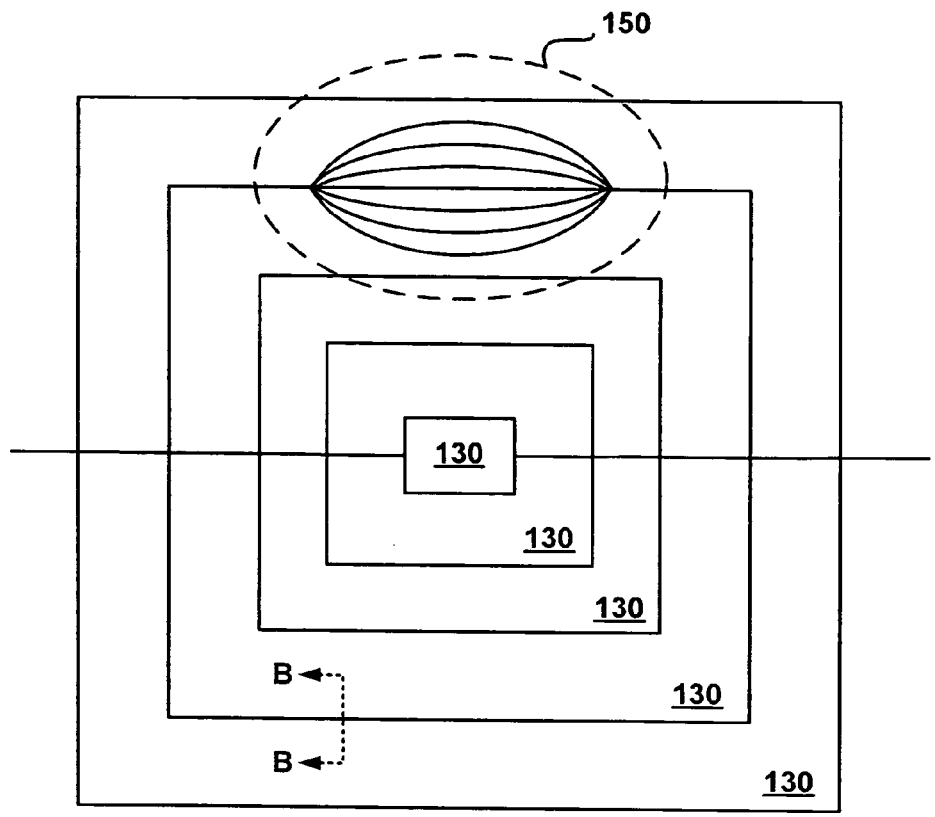
FIG. 1B is a top down view of the die in FIG. 1A illustrating the concentration of horizontal channels in a hot spot of the die, in accordance with one embodiment of the present invention.

FIG. 1B is a top view of the die 100A of FIG. 1A illustrating the concentration of horizontal channels in a hot spot of the die 100A, in accordance with one embodiment of the present invention. The top view of the die 100A presents a view of a horizontal plane 100B and is taken along the line A—A of FIG. 1A.

As shown in FIG. 1B, the one or more horizontal channels 130 are formed in the horizontal plane 100B and are used to circulate the cooling medium throughout the substrate 120. As a result, the entire substrate 120 can be used for transferring the thermal energy that is generated by the components in the die 100A.

In addition, a hot spot 150 is isolated in the horizontal plane 100B of the die 100A. The hot spot 150 may generate more thermal energy than in other regions of the substrate 120 of the die 100A. In accordance with embodiments of the present invention, the horizontal channels 130 can be increased, or more concentrated, in the hot spot region 150 in order to circulate more of the cooling medium in that region 150. As a result, the thermal energy can be effectively transferred away from hot spot region 150 ensuring the proper operation of the components of the die not only in the hot spot region 150, but throughout the die 100A.

Figure 2A:
FIG. 2A is a cross sectional view of a horizontal channel in FIG. 1B, in accordance with one embodiment of the present invention.
Figure 2B:
FIG. 2B is a cross sectional view of a horizontal channel in FIG. 1B, in accordance with one embodiment of the present invention.
Figure 2C:
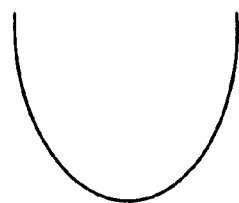
FIG. 2C is a cross sectional view of a horizontal channel in FIG. 1B, in accordance with one embodiment of the present invention.

Now referring to FIGS. 2A, 2B, and 2C, exemplary cross sections of the horizontal channel 130 taken along line B—B of FIG. 1B are shown, in accordance with embodiments of the present invention. The horizontal channels 130 are formed through various methods and processes. In one embodiment, the horizontal channels are formed through a mechanical process. That is, the horizontal channels are milled or carved out of the substrate 120.

In another embodiment, the horizontal channels 130 are formed through a photolithography process during the fabrication of the die 100A. That is, layers may be built up on the semiconductor substrate 120, that are then masked and etched to create the horizontal channels 130. The layers can be removed through any standard process to form the horizontal channel of the designed specification.

In FIG. 2A, the cross section 200A of the horizontal channel 130 taken along line B—B shows straight sidewalls. In FIG. 2B, the cross section 200B of the horizontal channel 130 taken along line B—B shows angled sidewalls. Angulation of the sidewalls may provide increased surface area for increased transfer of thermal energy between the substrate 120 and the cooling medium circulating through the horizontal channels 130. In FIG. 2C, the cross section 200C of the horizontal channels taken along line B—B shows curved sidewalls. Curved sidewalls may also increase the surface area of the horizontal channels 130.

Figure 3:
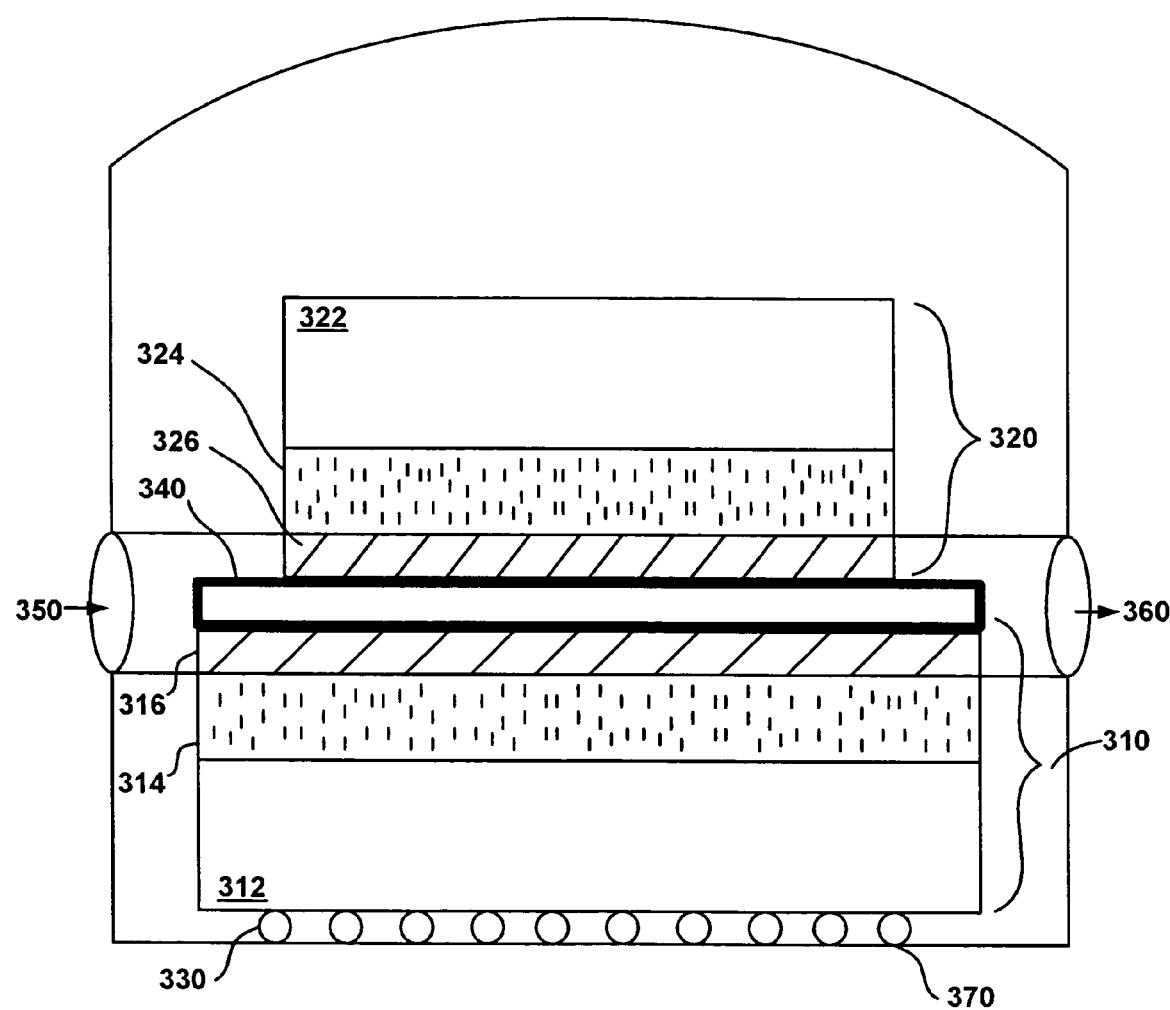
FIG. 3 is a cross sectional view of a stacked die configuration in a package illustrating integrated horizontal channels for the circulation of a cooling medium for cooling the stacked die configuration, in accordance with one embodiment of the present invention.

FIG. 3 is a cross section of a stacked die configuration in an optional package 300 illustrating the use of horizontal channels for transferring thermal energy away from the stacked die configuration, in accordance with one embodiment of the present invention. The stacked die configuration includes a bottom die 310 that is coupled to a build on substrate 370 in a flip chip configuration. The bottom die 310 is coupled to the build on substrate 370 via a plurality of solder balls 330, in one embodiment. The plurality of solder balls 330 facilitates surface mounting the stacked die configuration to the build on substrate 370 without the need for a socket.

The bottom die 310 includes an active region 312 of electrical components that are formed on a front side of a substrate 314. The components when in operation generate thermal energy. The bottom die also includes one or more integrated horizontal channels 316 that circulate a cooling medium to transfer thermal energy away from the die 310.

The stacked die configuration in the package 300 includes another die 320, a top die, that is coupled to the bottom die 310. The top die 320 is assembled in a standard configuration. That is, the top die 320 and the bottom die are assembled in a back-to-back configuration. The top die 320 includes an active region 322 of electrical components that are formed on a front side of a substrate 324. The components when in operation generate thermal energy. The top die also includes one or more integrated horizontal channels 326 that circulate a cooling medium to transfer thermal energy away from the die 320.

An optional sealing layer 340 is shown between the top die 320 and the bottom die 310 for sealing the horizontal channels in the top die 320 and the bottom die 310, in one embodiment of the present invention. The sealing layer 340 concentrates circulation of the cooling medium to the horizontal channels in the top die 320 and the bottom die 310.

In another embodiment, the top die 320 and the bottom die 310 are coupled directly in a back-to-back configuration. In that way, the sealing layer 340 is not implemented. As a result, the cooling medium circulates more directly between the two die in the stacked die configuration. The horizontal channels in the top die 320 and the bottom die 310 can be configured to fully overlap each other, in one embodiment.

The package 300 also illustrates one or more inlet ports 350 that are coupled to inlets of the horizontal channels of the top die 320 and the bottom die 310. The package 300 also illustrates one or more outlet ports 360 that are coupled to outlets of the horizontal channels of the top die 320 and the bottom die 310. The outlet port transfers the cooling medium away from the stacked die configuration to a heat exchanger (not shown) that may be included within the package or located remotely from the package. The cooling medium is circulated back to the package 300 through the inlet ports 350.

Referring now to FIG. 4, a cross sectional view of a die 400 is shown illustrating the use of integrated vertical holes for cooling the die 400, in accordance with one embodiment of the present invention. Embodiments of the present invention as shown in FIG. 4 are illustrative of the use of integrated vertical holes for cooling exemplary die structures of integrated circuits.

The die 400 comprises a cooling system for cooling semiconductor devices, or components that are located on a front side of a semiconductor substrate 420. The components are formed in an active region 410 of the die 400. When in operation, the components in the active region 410 generate thermal energy.

As shown in FIG. 4, one or more horizontal channels 430 are formed in a backside of the semiconductor substrate 420. The horizontal channels are used for collecting thermal energy that is generated by the components in the active region 410 as transferred through the substrate 420.

In addition, the cooling system as shown in FIG. 4 includes a cooling medium that is circulated within the one or more horizontal channels. The cooling medium transfers the thermal energy away from the die 400. The cooling medium can be circulated to a heat exchanger (not shown) passively or actively. In that way, the thermal heat that is generated by the components in the active region 400 is transferred away from the die 400.

Also, the cooling system as shown in FIG. 4 includes one or more vertical holes 450 formed within the die 400. The vertical holes 450 are coupled to the horizontal channels 430 for circulating the cooling medium through the die 400.

In particular, the one or more vertical holes 450 facilitates the circulation of the cooling medium in a stacked die configuration to limit the number of inlet ports and outlet ports associated with the stacked die configuration. In this way, thermal energy generated by the stacked die configuration is transferred away from the stacked die configuration.

In one embodiment, the stacked die configuration includes another, or second, die that is coupled to the die 400. The second die incorporates a semiconductor substrate upon which components are formed. The second die includes a group of one or more horizontal channels that are formed under a backside of the semiconductor substrate for collecting thermal energy. In the present embodiment, the vertical holes 450 of FIG. 400 couple the horizontal channels between the die 400 and the second die in the stacked die configuration to circulate a cooling medium throughout the stacked die configuration.

Figure 5A:
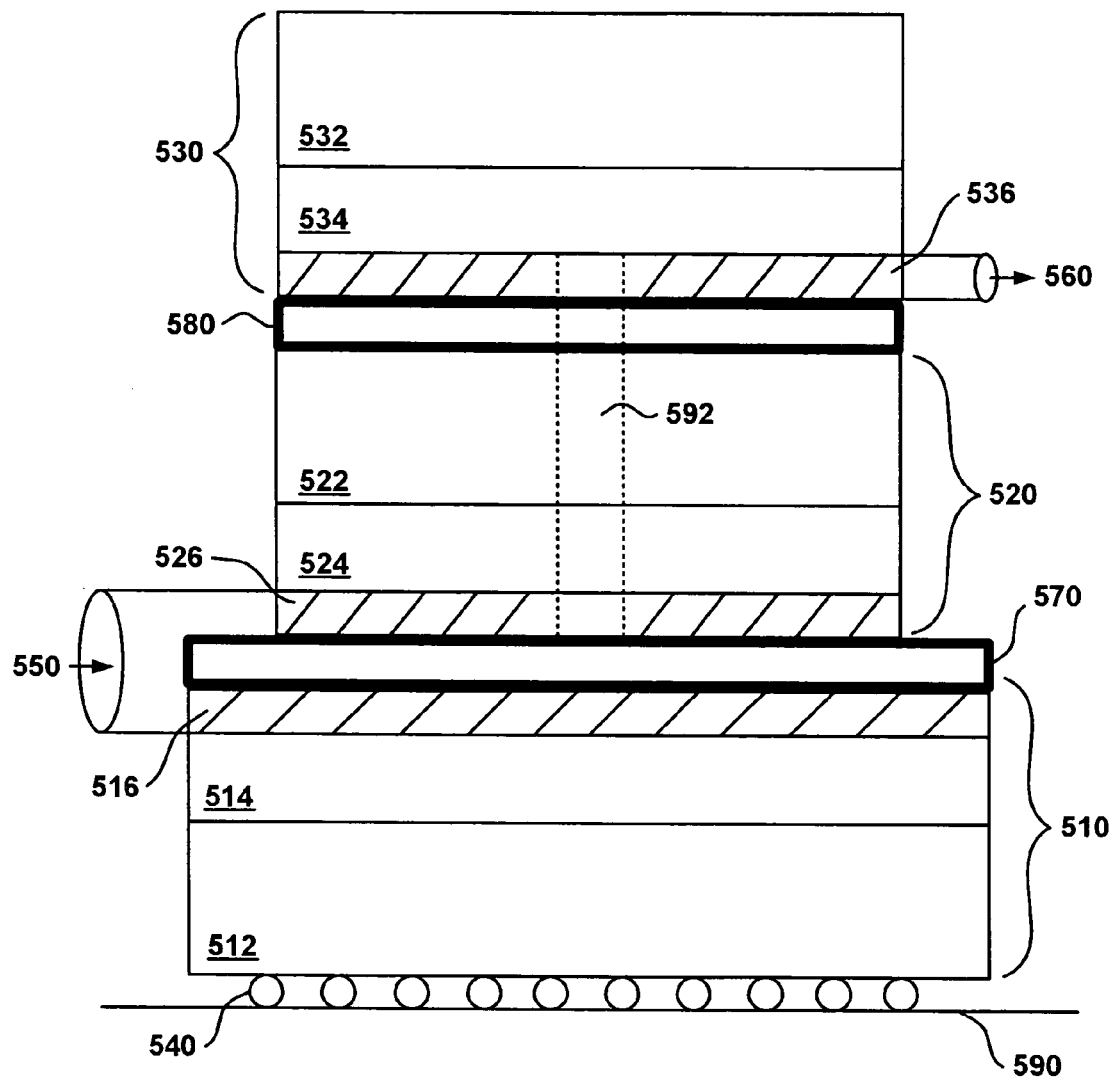
FIG. 5A is a cross sectional view of a stacked die configuration illustrating integrated horizontal channels and vertical holes for the circulation of a cooling medium for cooling the stacked die configuration, in accordance with one embodiment of the present invention.

FIG. 5A is a cross sectional view of a stacked die configuration 500A illustrating the use of vertical holes for cooling the stacked die configuration 500A, in accordance with one embodiment of the present invention. The stacked die configuration 500A includes a bottom die 510 that is coupled to a build on substrate 590 in a flip chip configuration. The bottom die 510 is coupled to the build on substrate 590 via a plurality of solder balls 540, in one embodiment.

The bottom die 510 includes an active region 512 of electrical components that are formed on a front side of a substrate 514. The components when in operation generate thermal energy. The bottom die 510 also includes one or more integrated horizontal channels 516 that circulate a cooling medium to transfer thermal energy away from the die 510.

The stacked die configuration 500A includes another die 520, a middle die, that is coupled to the bottom die 510. The middle die 520 is assembled in a standard configuration. That is, the middle die 520 and the bottom die 510 are assembled in a back-to-back configuration. The middle die 520 includes an active region 522 of electrical components that are formed on a front side of a substrate 524. The components when in operation generate thermal energy. The middle die 520 also comprises one or more integrated horizontal channels 526 that circulate a cooling medium to transfer thermal energy away from the die 520. The middle die 520 and the bottom die 510 are configured such that their respective horizontal channels are coupled.

The middle die 520 also includes a vertical hole 592. The vertical hole 592 couples the horizontal channels between each of the dies 510, 520, and 530 to facilitate the circulation of a cooling medium throughout the stacked die configuration 500.

An optional sealing layer 570 is shown between the middle die 520 and the bottom die 510 for sealing the horizontal channels in the middle die 520 and the bottom die 510, in one embodiment of the present invention. The sealing layer 570 concentrates circulation of the cooling medium to the horizontal channels in the middle die 520 and the bottom die 510. In another embodiment, the middle die 520 and the bottom die 510 are stacked directly together, as described previously in relation to FIG. 3.

A top die 530 is also shown in FIG. 5A. The top die is coupled to the middle die 520. The top die 530 is assembled in a standard configuration. The top die 530 includes an active region 532 of electrical components that are formed on a front side of a substrate 534. The components when in operation generate thermal energy. The top die 530 also includes one or more integrated horizontal channels 536 that circulate a cooling medium to transfer thermal energy away from the top die 530. An optional sealing layer 580 is shown coupled to the horizontal channels 536 to concentrate circulation of the cooling medium to the horizontal channels 536 in the top die 530.

In addition, the horizontal channels 536 in the top die are coupled to the vertical hole 592 to facilitate the circulation of the cooling medium. FIG. 5 also illustrates an inlet port 550 for circulating the cooling medium into the stacked die configuration 500A. It is understood that one or more inlet ports can be used in embodiments of the present invention. The inlet port 550 is shown coupled to the horizontal channels of the bottom die 510 and the middle die 520. In addition, FIG. 5A illustrates an outlet port 560 for circulating the cooling medium out from the stacked die configuration 500A. It is understood that one or more outlet ports 560 can be implemented in embodiments of the present invention. The outlet port 560 is shown coupled to the top die 530.

Figure 5B:
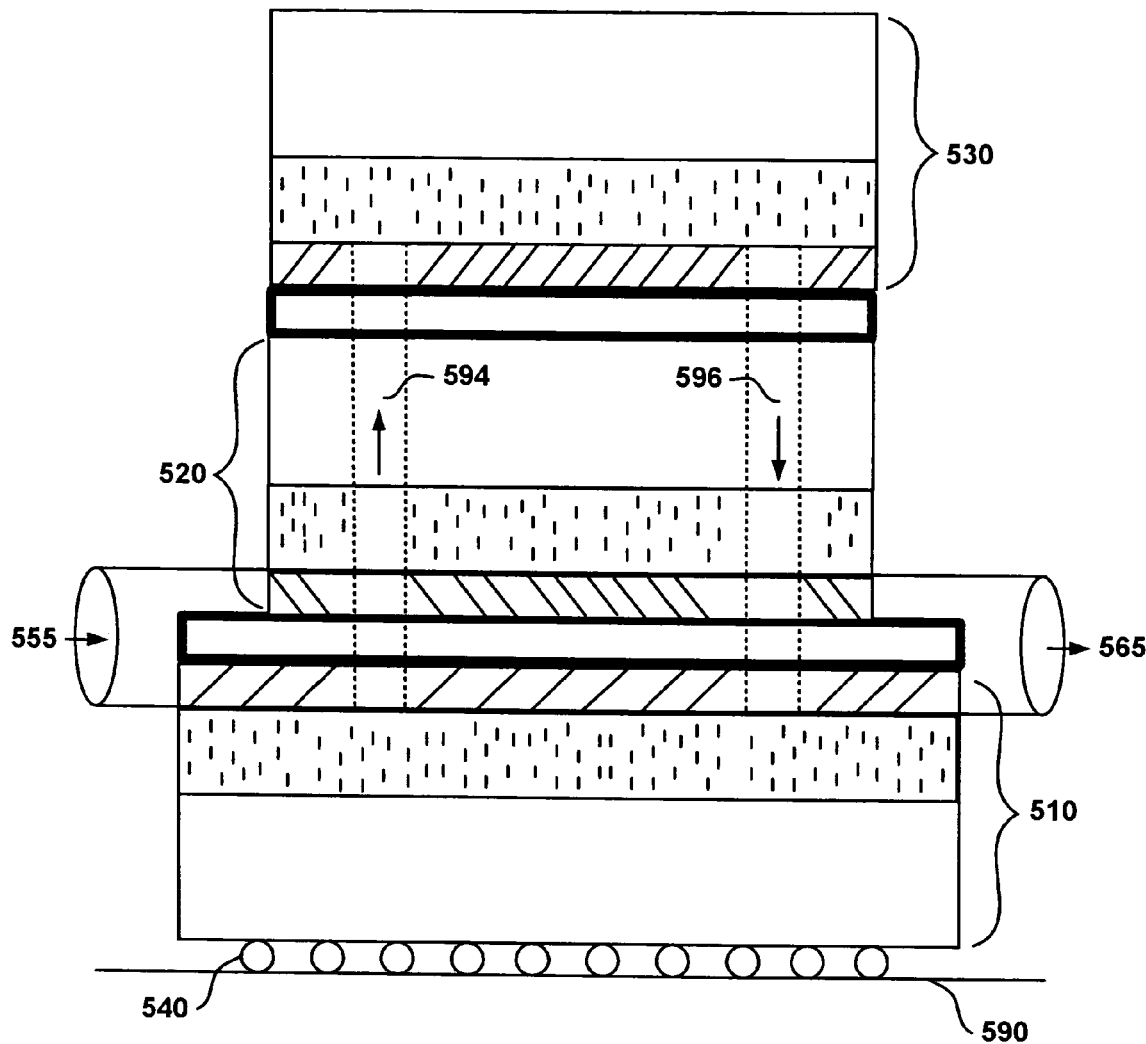
FIG. 5B is a cross sectional view of a stacked die configuration illustrating integrated horizontal channels and vertical holes for the circulation of a cooling medium for cooling the stacked die configuration, in accordance with one embodiment of the present invention.

FIG. 5B illustrates the stacked die configuration 500B that incorporates vertical holes for cooling the stacked die configuration 500B. The stacked die configuration 500B implements the three dies 510, 520, and 530 of FIG. 5A in the same configuration. However, the stacked die configuration 500B includes one or more vertical holes 594 that circulate the cooling medium from the bottom die 510 to the top die 530, and the one or more vertical holes 596 circulate the cooling medium from the top die 530 down to the bottom die 510.

In addition, one or more inlet ports 555 are used to circulate the cooling medium into the stacked die configuration 500B from a heat exchanger (not shown). Also, one or more outlet ports 565 are used to circulate the cooling medium out from the stacked die configuration 500B from the heat exchanger.

Figure 6:
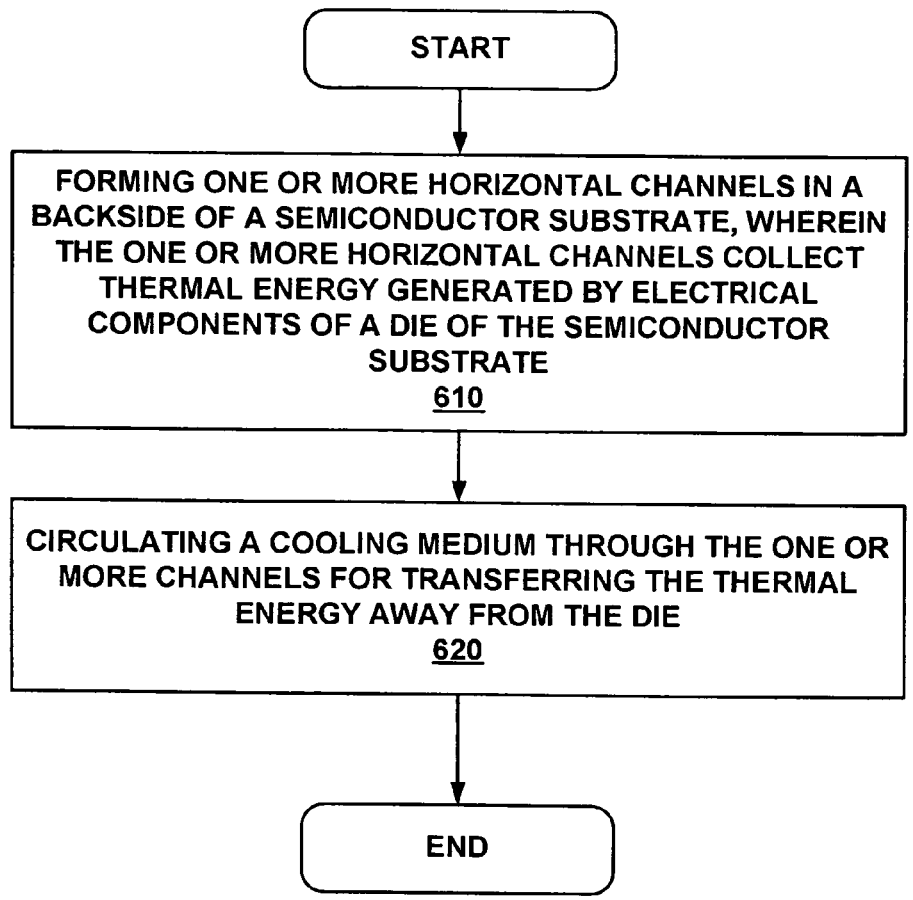
FIG. 6 is a flow chart illustrating steps in a method for cooling a die through the use of horizontal channels, in accordance with one embodiment of the present invention.

Referring now to FIG. 6, a flow chart 600 is disclosed illustrating steps in a method for cooling semiconductor devices, in accordance with one embodiment of the present invention. More specifically, the present embodiment utilizes integrated horizontal channels for cooling an integrated circuit formation on a die.

At 610, the present embodiment forms one or more horizontal channels in a backside of a semiconductor substrate. The semiconductor substrate is incorporated into a die structure including electrical components. The horizontal channels collect thermal energy generated by the components that are located on a front side of the substrate.

The horizontal channels are formed through mechanical means in one embodiment. In another embodiment, the horizontal channels are formed in the substrate through chemical etching. In still another embodiment, the horizontal channels are formed in the substrate through a photolithography process.

In addition, the present embodiment also forms the horizontal channels in greater concentrations around hot spots of the die. In this way, thermal energy from the die is cooled more efficiently.

At 620, the present embodiment circulates a cooling medium through the one or more channels. The cooling medium transfers thermal energy away from the die, as previously described. The present embodiment circulates the cooling medium to a heat exchanger to transfer thermal heat away from the die.

FIG. 7 is a flow chart 700 illustrating steps in a method for cooling semiconductor devices that incorporates the use of vertical holes. In one embodiment, the flow chart 700 is an extension of the flow chart 600 of FIG. 6.

At 710, the present embodiment forms one or more vertical holes through a die. The die incorporates a substrate upon which electrical components are formed on a front side of the substrate. In addition, horizontal channels are formed in a back side of the substrate for circulating a cooling medium to transfer thermal energy away from the die.

At 720, the vertical holes are coupled to the horizontal channels to facilitate the circulation of the cooling medium through the die. In particular, the preset embodiment is utilized in stacked die structures to enable the cooling of dies that would not be cooled in an efficient manner using traditional techniques.

Specifically, at 730, the present embodiment stacks the die comprising vertical holes as described in 710 to one or more die in a stacked die configuration. Each die in the stacked die configuration comprises one or more horizontal channels for collecting associated thermal energy. In particular, the vertical holes couple each of the horizontal channels in the stacked die configuration to facilitates the circulation of the cooling medium both within the stacked die configuration, and into and out from the stacked die configuration.

In another embodiment, the process of flow chart 700 further includes encapsulating the stacked die configuration into a package. The package comprises at least one inlet for circulating the cooling medium into the horizontal channels of the stacked die configuration. The package also comprises at least one outlet for circulating the cooling medium out from said horizontal channels of the stacked die configuration.

In still another embodiment, the package comprises the entire cooling system. That is utilizing microelectromechanical systems (MEMS) techniques, a MEMS pump (e.g., a piezoelectric pump) can be incorporated into the package for providing a means for circulating the cooling medium. In addition, a heat exchange is located within the package, in another embodiment.

While the methods of embodiments illustrated in flow charts 600 and 700 show specific sequences and quantity of steps, the present invention is suitable to alternative embodiments. For example, not all the steps provided for in the method are required for the present invention. Furthermore, additional steps can be added to the steps presented in the present embodiment. Likewise, the sequences of steps can be modified depending upon the application.

Embodiments of the present invention, an apparatus and method for cooling semiconductor devices have been described. While the invention is described in conjunction with the preferred embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

What is claimed:

1. A method for cooling, comprising:
   forming one or more horizontal channels in a backside of a semiconductor substrate, wherein said one or more horizontal channels collect thermal energy generated by electrical components of a stacked die configuration incorporating said semiconductor substrate; and
   circulating a cooling medium through said one or more channels for transferring said thermal energy away from said stacked die, wherein said stacked die comprises a plurality of dies in a stacked die configuration comprising:
      a first die coupled to a build up substrate in a flip chip configuration; and
      a second die coupled back-to-back to said first die such that said one or more horizontal channels for said first die and said second die are coupled.

2. The method of claim 1, wherein said electrical components are located on a front side of said semiconductor substrate.

3. The method of claim 1, further comprising:
mechanically forming said one or more horizontal channels.

4. The method of claim 1, further comprising:
etching said one or more horizontal channels in a photolithography process.

5. The method of claim 1, wherein said one or more horizontal channels are dispersed near at least one hot spot of said stacked die.

6. The method of claim 1, further comprising:
forming one or more vertical holes through said stacked die; and
coupling said one or more vertical holes to said one or more horizontal channels for circulating said cooling medium.

7. The method of claim 6
wherein each die in said stacked die configuration comprises one or more horizontal channels for collecting thermal energy; and
said horizontal channels and said one or more vertical holes in said stacked die configuration are coupled for circulating said cooling medium.

8. The method of claim 2
wherein each die in said stacked die configuration comprises one or more horizontal channels for collecting thermal energy; and
said horizontal channels in said stacked die configuration are coupled for circulating said cooling medium.

9. The method of claim 2, further comprising:
sealing said one or more horizontal channels with a capping layer for providing leak proof circulation of said cooling medium through said die.

10. The method of claim 1, further comprising:
encapsulating said stacked die configuration in a package, wherein said package comprises at least one inlet for circulating said cooling medium into said one or more horizontal channels of said stacked die configuration, and at least one outlet for circulating said cooling medium out from said one or more horizontal channels of said stacked die configuration.

* * * * *